(12) United States Patent
Huang et al.

(10) Patent No.: US 10,559,470 B2
(45) Date of Patent: Feb. 11, 2020

(54) CAPPING STRUCTURE

(71) Applicant: GLOBALFOUNDRIES INC., Grand Cayman (KY)

(72) Inventors: Haigou Huang, Rexford, NY (US); Jinsheng Gao, Clifton Park, NY (US); Hong Yu, Rexford, NY (US); Jinping Liu, Ballston Lake, NY (US); Huang Liu, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/876,407

(22) Filed: Jan. 22, 2018

(65) Prior Publication Data

US 2019/0228976 A1 Jul. 25, 2019

(51) Int. Cl.
| | |
|---|---|
| *H01L 27/08* | (2006.01) |
| *H01L 21/28* | (2006.01) |
| *H01L 21/76* | (2006.01) |
| *H01L 21/8234* | (2006.01) |
| *H01L 27/088* | (2006.01) |
| *H01L 21/311* | (2006.01) |
| *H01L 21/768* | (2006.01) |

(52) U.S. Cl.
CPC .. *H01L 21/28247* (2013.01); *H01L 21/31116* (2013.01); *H01L 21/823456* (2013.01); *H01L 21/823475* (2013.01); *H01L 27/0886* (2013.01); *H01L 21/76834* (2013.01); *H01L 21/823431* (2013.01)

(58) Field of Classification Search
CPC .......... H01L 27/0886; H01L 21/28247; H01L 21/76834
See application file for complete search history.

(56) References Cited

U.S. PATENT DOCUMENTS

| | | | | | |
|---|---|---|---|---|---|
| 5,436,489 | A | * | 7/1995 | Murase | H01L 21/28587 257/284 |
| 5,459,087 | A | * | 10/1995 | Mochizuki | H01L 21/28587 257/E21.452 |
| 5,496,748 | A | * | 3/1996 | Hattori | H01L 21/28587 257/E21.452 |
| 5,804,837 | A | * | 9/1998 | Han | H01L 21/28105 257/327 |
| 6,596,598 | B1 | * | 7/2003 | Krivokapic | H01L 21/26586 257/E21.205 |
| 6,717,210 | B2 | * | 4/2004 | Takano | H01L 29/7813 257/330 |
| 6,974,770 | B2 | * | 12/2005 | Costrini | H01L 21/76834 438/637 |

(Continued)

FOREIGN PATENT DOCUMENTS

JP 2001291867 A * 10/2001 ..... H01L 21/823456

*Primary Examiner* — Ida M Soward

(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to capping structures and methods of manufacture. The structure includes: a plurality of gate structures in a first location with a first density; a plurality of gate structures in a second location with a second density different than the first density; and a T-shaped capping structure protecting the plurality of gate structures in the first location and in the second location.

18 Claims, 6 Drawing Sheets

(56) References Cited

U.S. PATENT DOCUMENTS

| | | | |
|---|---|---|---|
| 7,498,270 B2* | 3/2009 | Gumpher | C23C 16/308 |
| | | | 257/E21.267 |
| 7,679,136 B2* | 3/2010 | Kachi | H01L 29/66727 |
| | | | 257/330 |
| 8,461,692 B2* | 6/2013 | Rhodes | H01L 21/76831 |
| | | | 257/774 |
| 9,093,560 B2 | 7/2015 | Tsung-Liang et al. | |
| 9,147,767 B2* | 9/2015 | Chen | H01L 29/7851 |
| 9,214,358 B1 | 12/2015 | Chao et al. | |
| 9,230,822 B1 | 1/2016 | Yu et al. | |
| 9,401,416 B2 | 7/2016 | Yu et al. | |
| 9,425,048 B2* | 8/2016 | Lin | H01L 29/402 |
| 9,466,723 B1 | 10/2016 | Huang et al. | |
| 9,589,807 B1 | 3/2017 | Huang et al. | |
| 9,620,622 B2* | 4/2017 | Farmer | H01L 21/0226 |
| 9,754,837 B1 | 9/2017 | Huang et al. | |
| 9,818,877 B2* | 11/2017 | Basker | H01L 29/7853 |
| 9,876,010 B1* | 1/2018 | Zang | H01L 27/0629 |
| 9,929,271 B2* | 3/2018 | Chang | H01L 21/28008 |
| 9,984,936 B1* | 5/2018 | Xie | H01L 29/775 |
| 10,038,065 B2* | 7/2018 | Xie | H01L 29/41783 |
| 10,163,704 B2* | 12/2018 | Chen | H01L 29/6656 |
| 10,211,100 B2* | 2/2019 | Xie | H01L 21/764 |
| 10,211,103 B1* | 2/2019 | Huang | H01L 29/66545 |
| 10,236,215 B1* | 3/2019 | Xie | H01L 21/823475 |
| 10,249,726 B2* | 4/2019 | Xie | H01L 29/665 |
| 10,297,452 B2* | 5/2019 | Xie | |
| 2002/0047171 A1* | 4/2002 | Chiu | H01L 21/28114 |
| | | | 257/412 |
| 2004/0043549 A1* | 3/2004 | Sayama | H01L 21/28044 |
| | | | 438/197 |
| 2010/0317162 A1* | 12/2010 | Kakoschke | H01L 21/84 |
| | | | 438/151 |
| 2015/0111373 A1* | 4/2015 | Cote | H01L 21/823468 |
| | | | 438/586 |
| 2015/0303295 A1* | 10/2015 | Wan | H01L 29/785 |
| | | | 257/401 |
| 2016/0133623 A1* | 5/2016 | Xie | H01L 27/088 |
| | | | 257/384 |
| 2016/0225903 A1* | 8/2016 | Li | H01L 29/7848 |
| 2017/0077247 A1* | 3/2017 | Xie | H01L 29/78 |
| 2018/0366461 A1* | 12/2018 | Zang | H01L 27/0629 |
| 2019/0096677 A1* | 3/2019 | Xie | |
| 2019/0109045 A1* | 4/2019 | Xie | H01L 21/76897 |
| 2019/0139823 A1* | 5/2019 | Chen | H01L 21/76883 |

* cited by examiner

CAPPING STRUCTURE

FIELD OF THE INVENTION

The present disclosure relates to semiconductor structures and, more particularly, to capping structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate back end of line (BEOL) and middle of line (MOL) metallization features, e.g., interconnects, due to the critical dimension (CD) scaling and process capabilities, as well as materials that are used to fabricate such structures.

For example, to manufacture interconnect structures for source and drain contacts, it is necessary to remove dielectric material adjacent to the gate structures. The removal of the dielectric material is provided by an etching process which also tends to erode the spacer material of the gate structure. That is, the low-k dielectric material used for the spacer or sidewalls of the gate structure can be eroded away in the downstream etching processes used to form the openings for the drain and source contacts. This loss of material will expose the metal material of the gate structure, resulting in a short between the metal material of the gate structure and the metal material used to form the contact, itself.

Also, for smaller technology nodes, particularly those manufactured using non-self-aligned contact (SAC) schemes and extreme ultra violet (EUV) schemes, final gate height control between different macros is critical for device performance. However, the current chemical mechanical polishing (CMP) schemes, particularly for tungsten (W), is challenging to achieve the final gate height for the designed device performance. For example, macro-loading on different density macros is a fundamental issue for CMP multi-material polishing. More specifically, due to the macro loading issues in W gate CMP, in the long gate location, work function materials (WFM) become exposed which can result in source/drain to gate shorting issues.

SUMMARY

In an aspect of the disclosure, a structure comprises: a plurality of gate structures in a first location with a first density; a plurality of gate structures in a second location with a second density different than the first density; and a T-shaped capping structure protecting the plurality of gate structures in the first location and in the second location.

In an aspect of the disclosure, a structure comprises: a plurality of recessed gate structures; and a T-shaped capping structure located partly within recesses of the plurality of recessed gate structures, the T-shaped capping being positioned and structured to protect the plurality of gate structures during source/drain contact processes.

In an aspect of the disclosure, a method comprises: forming a plurality of gate structures in a first location with a first density; forming a plurality of gate structures in a second location with a second density different than the first density; and forming a T-shaped capping structure protecting the plurality of gate structures in the first location and in the second location.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
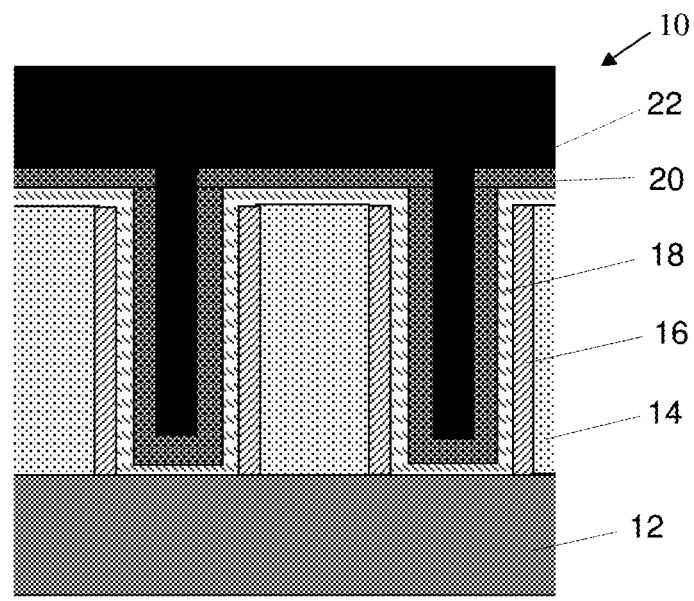
FIGS. 1A and 1B shows a starting gate module structure in both the short gate location and long gate location, respectively, and respective fabrication processes in accordance with aspects of the present disclosure.

The present disclosure relates to semiconductor structures and, more particularly, to capping structures and methods of manufacture. More specifically, the present disclosure is directed to a T-shaped capping structure and methods of manufacture. Advantageously, the T-shaped capping structure and methods of manufacture will mitigate metal (e.g., W) gate CMP macro-loading issues, e.g., prevent exposure of work function materials and subsequent shorting issues.

In embodiments, the T-shaped capping structure is a SiN/SiCN cap structure, formed over gate structures in a long gate location and a short gate location. In more specific embodiments, the structure comprise a first gate structure formed in a first location and a second gate structure formed in a second location (of different densities), both over a semiconductor substrate. A T-shaped SiN cap structure is provided over the first gate structure and the second gate structure. The gate structures comprise, for example, a first low-k dielectric spacer adjacent to the first gate structure, a high-k dielectric material and gate metals, wherein the T-shaped SiN cap structure is over the these materials.

As should be understood herein, in embodiments, the methods and structure described herein use oxide to replace W and WFM to minimize CMP pattern density dependent which would cause macro-loading. That is, the methods described herein allows for the creation of a uniform final gate height structure across different macros, e.g., across different density macros (device densities) both in the short gate location and long gate location. Also, the T-shaped capping structure will protect the gate metals during source and drain contact processes.

It should be understood further by those of skill in the art that the gate structures in the different locations can be formed simultaneously, as is the capping structure on the gate structures. For example, the gate structure can be formed by depositing metal materials (e.g., work function metals (WFM) and gate metals), followed by recessing the metal layers and an underlying low-K spacer. A capping material (e.g., SiN) and oxide is deposited within the recess, followed by CMP of the oxide and a non-selective etch process of both the capping material and the oxide. The resultant structure is a T-shaped capping structure, which protects the WFM during subsequent contact formation processes.

The capping structure of the present disclosure can be manufactured in a number of ways using a number of different tools. In general, though, the methodologies and tools are used to form structures with dimensions in the micrometer and nanometer scale. The methodologies, i.e., technologies, employed to manufacture the capping structure of the present disclosure have been adopted from integrated circuit (IC) technology. For example, the structures are built on wafers and are realized in films of material patterned by photolithographic processes on the top of a wafer. In particular, the fabrication of the capping structure uses three basic building blocks: (i) deposition of thin films of material on a substrate, (ii) applying a patterned mask on top of the films by photolithographic imaging, and (iii) etching the films selectively to the mask.

Figure 1B:
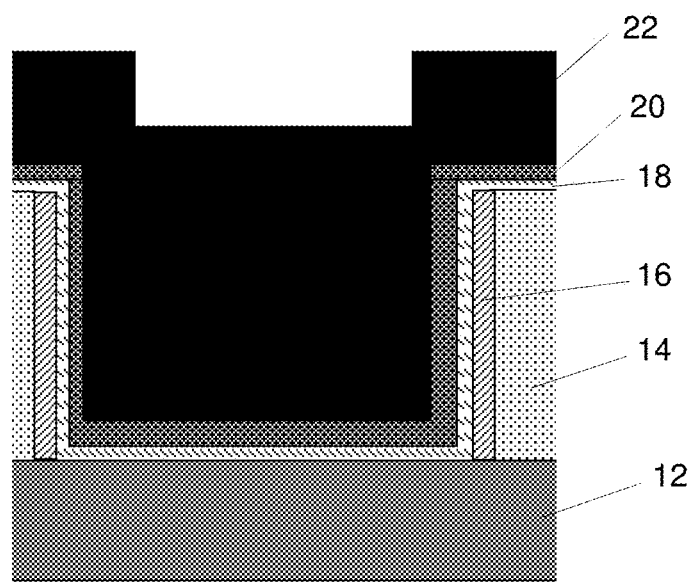

FIGS. 1A and 1B shows a starting gate module structure in both the short gate location and long gate location, respectively, and respective fabrication processes in accordance with aspects of the present disclosure. In particular, the structure 10 includes a fin structure 12 composed of substrate material. In embodiments, the substrate may be composed of any suitable semiconductor material including, but not limited to, Si, SiGe, SiGeC, SiC, GaAs, InAs, InP, and other III/V or II/VI compound semiconductors.

In embodiments, the fin structure 12 can be fabricated using a sidewall image technique (SIT). In an example of a SIT technique, a mandrel material, e.g., $SiO_2$, is deposited on the substrate material using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the narrow fin structures 12. Spacers are formed on the sidewalls of the mandrels which are preferably material that is different than the mandrels, and which are formed using conventional deposition processes known to those of skill in the art. The spacers can have a width which matches the dimensions of the narrow fin structures 20, for example. The mandrels are removed or stripped using a conventional etching process, selective to the mandrel material. An etching is then performed within the spacing of the spacers to form the sub-lithographic features. The sidewall spacers can then be stripped. In embodiments, the fin structures 12 can also be formed during this or other patterning processes, or through other conventional patterning processes, as contemplated by the present disclosure.

Still referring to FIG. 1, an insulator material (e.g., oxide) 14 is deposited and patterned on the fin structures 12 using known deposition and patterning processes, e.g., used in conventional replacement gate processes. In the replacement gate processes, for example, sidewall spacers 16 are formed within trenches formed in the insulator material 14, followed by deposition of dummy fill material (not shown). In embodiments, the sidewall spacer material can be, e.g., a low-k dielectric material.

After the removal of the dummy or sacrificial material, a dielectric material 18 is deposited over sidewall spacers 16 and exposed portions of the insulator material 14. In embodiments, the dielectric material 18 is a high-k gate dielectric material. The high-k dielectric material 18 can be a hafnium based dielectrics, as an example. In further embodiments, examples of such high-k dielectrics include, but are not limited: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The dielectric material 18 can be deposited by a conformal deposition process, e.g., atomic layer deposition (ALD), to a thickness of about 1 nm, to about 1.5 nm; although other dimensions are contemplated herein.

A workfunction metal (WFM) 20 is deposited on the dielectric material 18. The WFM 20 can be any WFM used to tune a device for particular NFET or PFET applications. For example, the WFM 20 can be TiN/Ti combination, which provides selectivity of materials for subsequent processing. In embodiments, the WFM 20 can be deposited by an ALD process to a thickness of about 4 nm to about 5 nm; although other dimensions are contemplated herein, allowing space for subsequent deposition of a metal material 22. In embodiments, the metal material 22 can be tungsten deposited by a conventional deposition method, e.g., a Plasma Vapor Deposition (PVD).

Figure 2A:
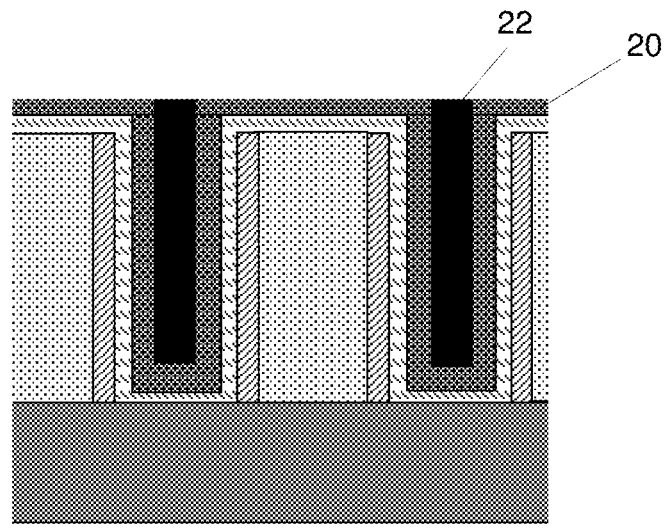
FIGS. 2A and 2B shows a planarized work function metal of gate structures in both the short gate location and long gate location, respectively, and respective fabrication processes in accordance with aspects of the present disclosure.
Figure 2B:
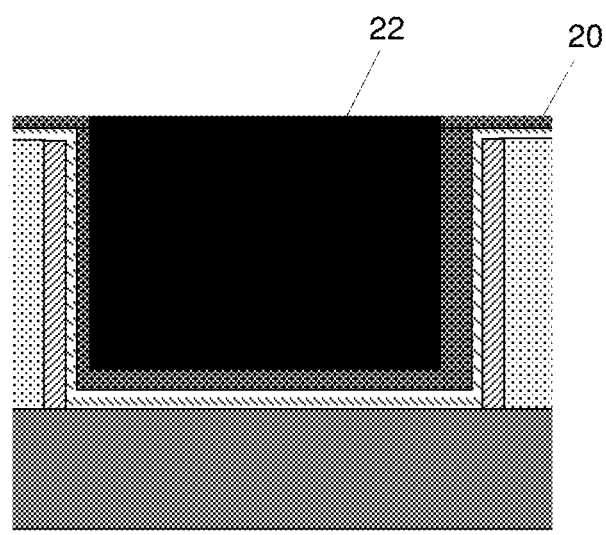

Referring to FIGS. 2A and 2B, the metal material 22 is planarized to a level of the WFM 20. In embodiments, the metal material 22 can be planarized by a conventional chemical mechanical polishing (CMP), which will stop on the WFM 20. This planarization occurs in both the long gate location and the short gate location, e.g., macros with different gate (device) densities. As should be understood by those of skill in the art, a replacement gate structure will be composed of the combination of the metal material 22, the WFM 20 and the dielectric material 18.

Figure 3A:
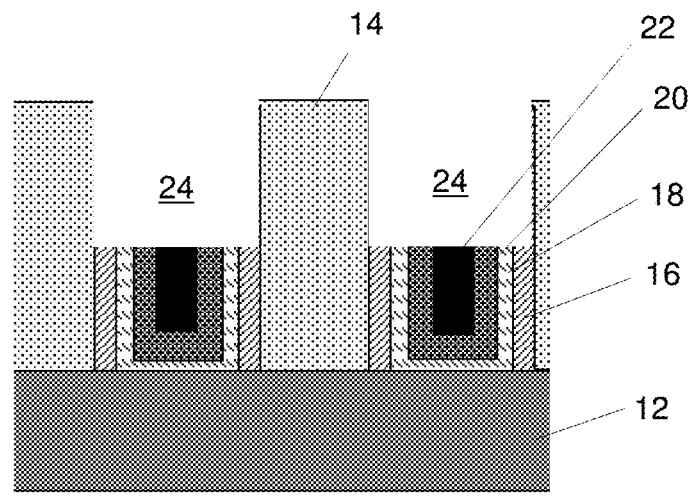
FIGS. 3A and 3B shows a recess of the gate structures in both the short gate location and long gate location, respectively, and respective fabrication processes in accordance with aspects of the present disclosure.
Figure 3B:
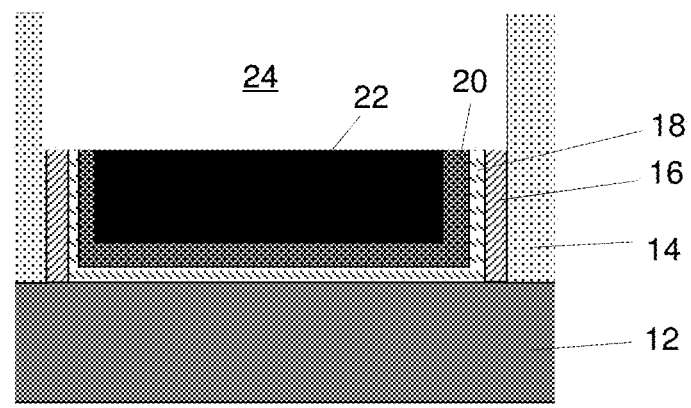

In FIGS. 3A and 3B, the replacement gate structures for both the short gate location and the long gate location are recessed using selective etching processes. For example, the sidewall spacers 16, the dielectric material 18, the WFM 20 and the metal material 22 are etched to form a recess 24. In embodiments, the recesses 24 are formed by conventional reactive ion etching processes, with selective chemistries for the removal of the materials 16, 18, 20, 22. It should be understood by those or ordinary skill in the art that the etching processes do not require a mask due to the selectivity of the materials being etched. In embodiments, the recesses 24 can be about 35 nm to 50 nm deep; although other dimensions are also contemplated herein, e.g., about 50% or less of the gate height.

Figure 4A:
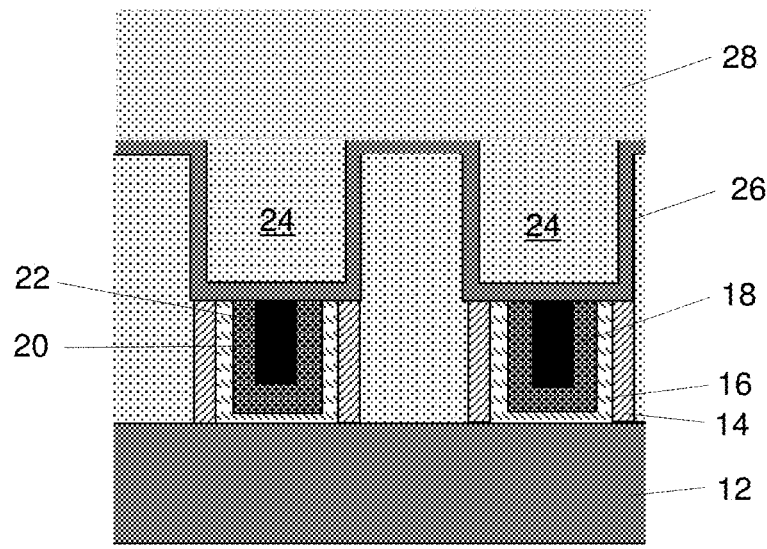
FIGS. 4A and 4B shows a liner (capping material) and insulator material in the recess in both the short gate location and long gate location, respectively, and respective fabrication processes in accordance with aspects of the present disclosure.
Figure 4B:
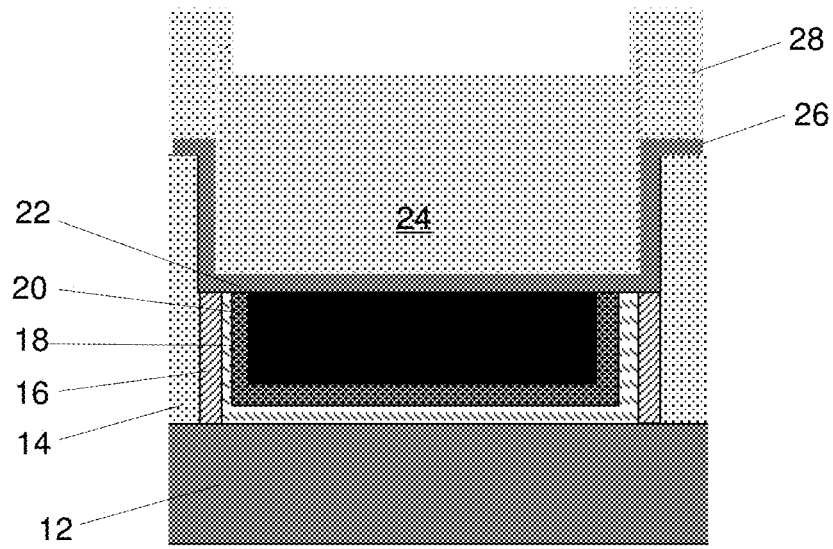

As shown in FIGS. 4A and 4B, a liner or capping material 26 is deposited within the recesses 24 for both the short gate location and the long gate location, over the materials 16, 18, 20, 22 and any exposed insulator material 14. In embodiments, the liner or capping material 26 is SiN. In further embodiments, the liner or capping material 26 can be SiNC. The liner or capping material 26 can be deposited by a conventional ALD deposition process to a thickness that would provide an etch or CMP stop layer for an oxide material 28 deposited over the liner or capping material 26. For example, the liner or capping material 26 can be deposited to a thickness of about 5 nm. The oxide material 28 can be a flowable oxide material, deposited in a flowable process. In embodiments, the oxide material 28 can also be a high density oxide deposited by a chemical vapor deposition (CVD) process.

The deposition of the oxide material 28 will replace tungsten and WFM metals, resulting in a pattern density that is the same in the short gate location and the long gate location. This pattern density will allow for better final gate height control between different macros (e.g., short gate location and long gate location which have different gate densities) even using subsequent CMP processes and source/drain contact processes. More specifically, the oxide material 28 assists in the fabrication of uniform final gate height structures across different macros.

Figure 5A:
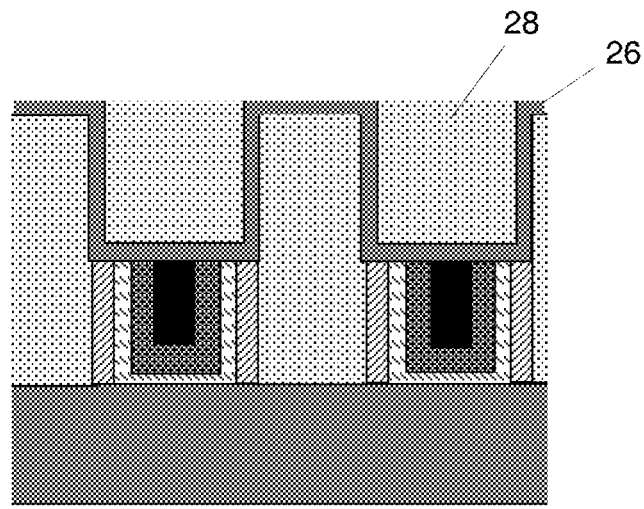
FIGS. 5A and 5B shows insulator layer being planarized in both the short gate location and long gate location, respectively, and respective fabrication processes in accordance with aspects of the present disclosure.
Figure 5B:
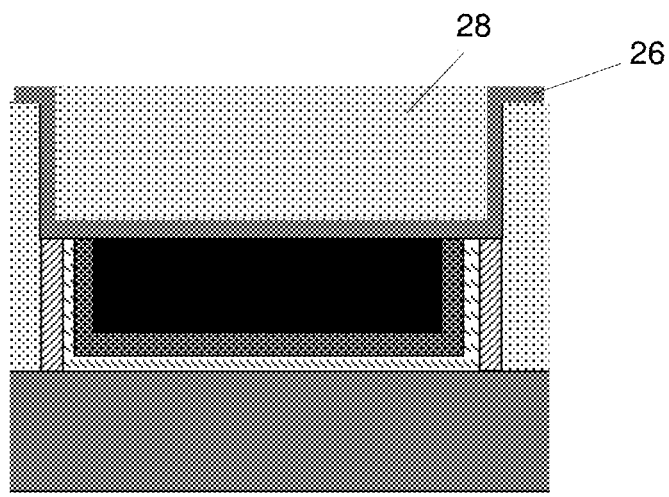

In FIGS. 5A and 5B, the oxide material 28 is planarized stopping on the liner or capping material 26. The oxide material 28 can be planarized using a conventional CMP process, with the liner or capping material 26 acting as a CMP stop layer.

Figure 6A:
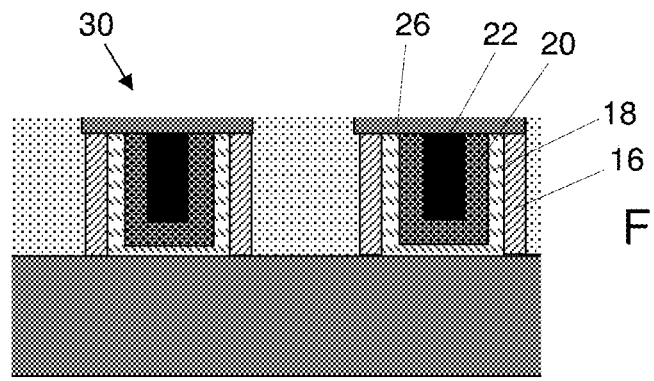
FIGS. 6A and 6B shows the capping material on the work function metal in both the short gate location and long gate location, respectively, and respective fabrication processes in accordance with aspects of the present disclosure.
Figure 6B:
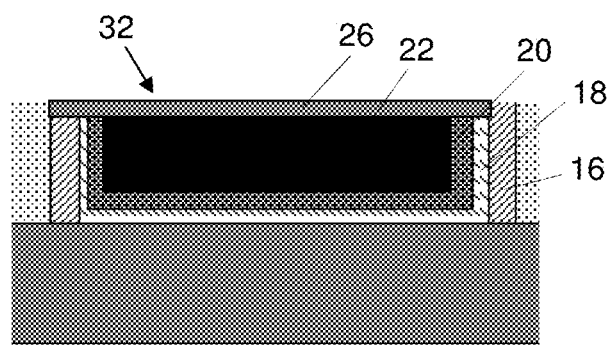

As shown in FIGS. 6A and 6B, any remaining oxide material 28 and portions of the liner or capping material 26 which were deposited on the oxide material 28 are removed, leaving the liner or capping material 26 on the surface of the replacement gate structures 30 in the short gate location and the replacement gate structure 32 in the long gate location, e.g., materials 16, 18, 20, 22. That is, the liner or capping material 26 will remain over different macros of different densities.

In embodiments, the oxide material 28 and portions of the liner or capping material 26 can be removed by a timed etching process. More specifically, the oxide material 28 and portions of the liner or capping material 26 can be removed by a non-selective RIE (SiN:oxide=1:1) or slurry (SiN:oxide=1:1), as examples.

Figure 7A:
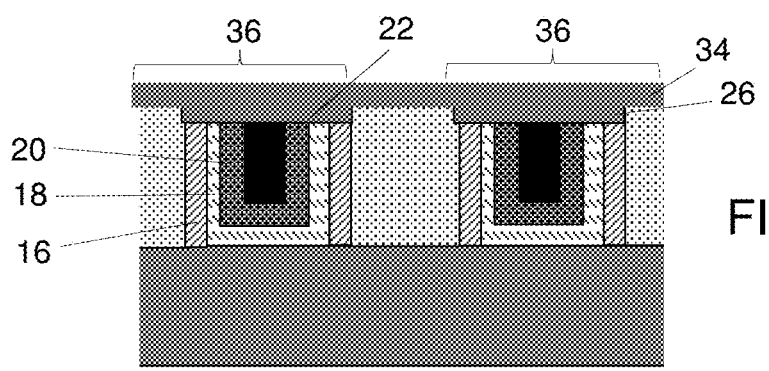
FIGS. 7A and 7B shows a T-shaped capping structure over the gate structures in both the short gate location and long gate location, respectively, and respective fabrication processes in accordance with aspects of the present disclosure.
Figure 7B:
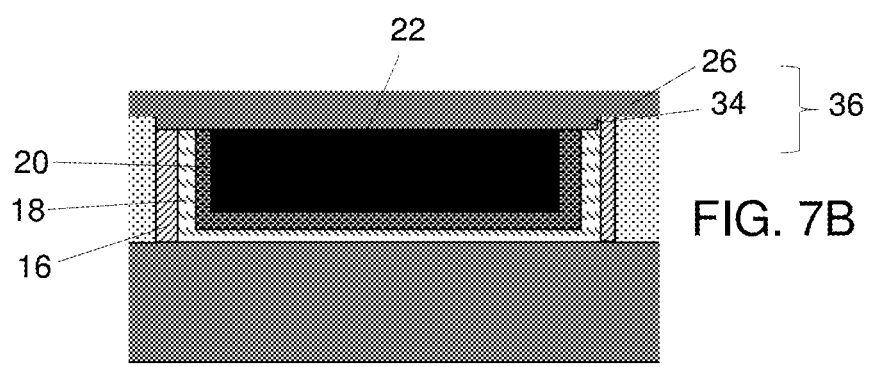

In FIGS. 7A and 7B, additional liner or capping material 34 is deposited on the liner or capping material 26 (and other exposed surfaces of the structure). In embodiments, the additional liner or capping material 34 can be SiN, deposited by a conventional ALD process to a thickness sufficient to protect the underlying gate structures 30, 32. For example, the additional liner or capping material 34 can be deposited to a thickness of about 5 nm. The combination of the liner or capping material 34 and the liner or capping material 26 will form a T-shaped capping structure 36 on the gate structures 30 in the short gate location and the replacement gate structure 32 in the long gate location, i.e., different gate structure macros. The T-shaped capping structure 36 will protect the metal material, e.g., material 20, 22, from any corrosion during subsequent source/drain contact processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
a plurality of gate structures in a first location with a first density;
a plurality of gate structures in a second location with a second density different than the first density; and
a T-shaped capping structure protecting the plurality of gate structures in the first location and in the second location,
wherein the plurality of gate structures in the first location are short gate structures and the plurality of gate structures in the second location are long gate structure and both the long gate structures and the short gate structure are replacement gate structures.

2. The structure of claim 1, wherein the plurality of gate structures in the first location are in a short gate location and the plurality of gate structures in the second location are in a long gate location, which have different device densities, and the long gate structures and the short gate structures have different width dimensions.

3. The structure of claim 2, wherein the T-shaped capping structure is composed of SiN.

4. The structure of claim 2, wherein the T-shaped capping structure is composed of SiNC.

5. The structure of claim 1, wherein the T-shaped capping structure is partly within a recessed portion of the plurality of gate structures in the first location and in the second location.

6. The structure of claim 5, wherein the T-shaped capping structure spans between the plurality of gate structures in the first location.

7. The structure of claim 6, wherein the T-shaped capping structure comprises a dielectric material lining the recessed portion of the plurality of gate structures in the first location and additional dielectric material spanning over insulator material between adjacent ones of the plurality of gate structures in the first location.

8. The structure of claim 7, wherein the dielectric material and the additional dielectric material are the same material.

9. The structure of claim 8, wherein the T-shaped capping structure covers sidewalls, dielectric material and gate metals of the plurality of gate structures.

10. The structure of claim 9, wherein the sidewalls, dielectric material and gate metals of the plurality of recessed gate structures are recessed and the T-shaped capping structure is provided partly within the recess.

11. The structure of claim 1, wherein the T-shaped capping structure covers sidewalls of the replacement gate structures, in addition to covering gate dielectric material, workfunction metal and gate metal material of the replacement gate structures.

12. A structure comprising:
a plurality of recessed gate structures; and
a T-shaped capping structure located partly within recesses of the plurality of recessed gate structures, the T-shaped capping structure being positioned and structured to protect the plurality of gate structures during source/drain contact processes, wherein the plurality of gate structures are long and short replacement gate structures.

13. The structure of claim 12, wherein the plurality of gate structures are provided in a short gate location and in a long gate location, which have different device densities.

14. The structure of claim 13, wherein the T-shaped capping structure is composed of SiN material.

15. The structure of claim 14, wherein the T-shaped capping structure covers sidewalls, dielectric material and gate metals of the plurality of recessed gate structures.

16. The structure of claim 12, wherein the T-shaped capping structure spans between the plurality of recessed gate structures in a first location and the plurality of recessed gate structures in the first location are the short replacement gate structures.

17. The structure of claim 16, wherein the T-shaped capping structure comprises a dielectric material lining a recessed portion of the plurality of recessed gate structures in the first location and additional dielectric material spanning over insulator material between adjacent ones of the plurality of recessed gate structures in the first location.

18. The structure of claim 17, wherein the T-shaped capping structure covers recessed sidewalls, dielectric material and gate metals of the plurality of recessed gate structures.

* * * * *